United States Patent [19]

Nakajima et al.

[11] Patent Number: 4,976,393

[45] Date of Patent: Dec. 11, 1990

[54] SEMICONDUCTOR DEVICE AND PRODUCTION PROCESS THEREOF, AS WELL AS WIRE BONDING DEVICE USED THEREFOR

[75] Inventors: Makoto Nakajima, Takasaki; Yoshio Ohashi, Tamamura; Toshio Chuma, Takasaki; Kazuo Hatori; Isao Araki, both of Tamamura; Masahiro Koizumi, Hitachi; Jin Onuki, Hitachi; Hitoshi Suzuki, Hitachi; Susumu Okikawa, Ohme, all of Japan

[73] Assignee: Hitachi, Ltd., Tokyo, Japan

[21] Appl. No.: 134,458

[22] Filed: Dec. 17, 1987

[30] Foreign Application Priority Data

| Dec. 26, 1986 | [JP] | Japan | 61-308435 |
| Apr. 8, 1987 | [JP] | Japan | 62-84758 |
| May 27, 1987 | [JP] | Japan | 62-128245 |
| May 27, 1987 | [JP] | Japan | 62-128246 |

[51] Int. Cl.$^5$ .................................. H01L 21/607
[52] U.S. Cl. ..................... 228/111; 228/179; 228/220; 219/56.21
[58] Field of Search ............... 225/110, 111, 179, 4.5; 219/56.21, 56.22; 228/220

[56] References Cited

U.S. PATENT DOCUMENTS 4,705,204 11/1987 Hirota et al. ............... 219/56.22 X
4,732,313 3/1988 Kobayashi et al. ............. 228/220 X

FOREIGN PATENT DOCUMENTS

| 88557 | 9/1983 | European Pat. Off. . | |
| 143540 | 8/1983 | Japan | 228/4.5 |
| 7137 | 1/1985 | Japan | 228/4.5 |
| 290732 | 12/1986 | Japan . | |
| 219935 | 9/1987 | Japan | 228/4.5 |
| 2137914 | 10/1984 | United Kingdom . | |
| 2146937 | 5/1985 | United Kingdom . | |
| 2157607 | 10/1985 | United Kingdom | 228/179 |

OTHER PUBLICATIONS

Atsumi et al., "Ball Bonding Technique for Copper Wire"; from 36th *Electronic Components Conference*, May 5th-7th, 1986, pp. 312-317, IEEE 1986.

Hirota et al., "The Development of Copper Wire Bonding for Plastic Molded Semiconductor Packages"; from 35th *Electronic Components Conference*, May 20th-22nd, 1985, pp. 116-121, IEEE 1985.

*Primary Examiner*—Kenneth J. Ramsey
*Attorney, Agent, or Firm*—Antonelli, Terry, Stout & Kraus

[57] ABSTRACT

The present invention concerns a semiconductor device and a process for producing semiconductor device, as well as a wire bonding device used therefor.

In accordance with the present invention, a ball formed at the top end of a bonding wire is sphericalized by electric discharge within a reducing gas atmosphere at a high temperature from 100° C. to 200° C. By using the ball of the bonding wire formed under such a condition to the bonding of the bonding pad of a semiconductor pellet, it is possible to conduct highly reliable ball bonding with excellent bondability and with no development of cracks or the like in the semiconductor pellet, as well as to obtain a highly reliable semiconductor device, that is, LSI or IC.

33 Claims, 9 Drawing Sheets

SEMICONDUCTOR DEVICE AND PRODUCTION PROCESS THEREOF, AS WELL AS WIRE BONDING DEVICE USED THEREFOR

BACKGROUND OF THE INVENTION

The present invention concerns a semiconductor device and a production process thereof, as well as a wire bonding device used therefor. More specifically, the present invention relates to an improvement for the bondability in the wire bonding, for example, to a technique useful when applied to electrical connection between electrodes and leads of a semiconductor pellet in the production steps of a semiconductor device.

The production process for a semiconductor device includes a wire bonding step for the electrical connection between electrodes of a semiconductor pellet on which a semiconductor device such as IC or LSI is formed and leads. As one of the wire bonding devices used in such a step, there has been known a ball-bonding type bonding device of applying a high voltage between an electric discharge electrode and the top end of a wire held by a capillary as a wire bonding tool, causing electric discharge to make the top end of the wire spherical (into a ball) and, thereafter, lowering the capillary to crush the ball therewith and press-bonding under heating, thereby connecting the wire to a body to be bonded. Further, there has also been known a wire bonding device in which the space between the top end of the wire and the discharge electrode disposed opposing thereto can be maintained as a reducing gas atmosphere.

Such a wire bonding device has been described, for example, in Japanese Patent Laid-Open No. Sho 58-169918.

In semiconductor devices such as ICs, LSIs, transistors, etc., gold (Au) wires of from 20 to 50 μm diameter have often been used for at present the connection between an aluminum (Al) electrode on a silicon (Si) chip (pellet) and a lead frame. Upon connecting the wire to the silicon chip, a ball is formed to the top end of a gold wire by means of electric discharge or hydrogen flame and the ball is connected by press-bonding under heating or supersonic welding. However, if the gold Au wire is made fine for making the density higher and the size smaller in a semi-conductor device, the strength of the wire is weakened thereby causing problems of deformation or disconnection of the wire upon resin encapsulation.

In view of the above, there has been an important subject for the development of a ball bonding tenchique using other materials than gold.

Copper (Cu) and aluminum (Al) may be considered as the material for the wire, and earnest studies have been made various research organizations for using copper (Cu) wires in view of the electroconductivity and the strength, because copper wire causes neither deformation nor disconnection even when it is made finer than the gold wire.

However, it has been considered extremely difficult technically to use the copper wire since it is oxidized more easily as compared with the gold wire, making it difficult to obtain a ball of a high spherical shape, as well as the hardness of the ball is high.

Recently, copper balls of high spherical shape can be obtained by forming a ball in an inert gas containing hydrogen as disclosed in Japanese Patent Laid-Open No. Sho 58-154241 and the study for the copper ball bonding has become vigorous.

Further, attempts for increasing the purity of the copper wire has been made for decreasing the ball hardness (Japanese Patent Laid-Open Nos. Sho 60-124959, 59-13662 and 59-139662). That is, if the ball hardness is high, since there is a great possibility of damaging the silicon chip upon ball bonding, the adequate bonding region is extremely narrow as compared with the case of gold wire, making it not suitable to the mass production. However, the ball hardness is not reduced by so much even if the purity of the copper is improved, and a novel technique for reducing the ball hardness has strongly been demanded.

SUMMARY OF THE INVENTION

It has been found by the present inventors that in the conventional wire bonding device as described above, the hardness of the spherical portion (ball) formed by the sphericalization is increased to reduce the bondability.

That is, electric discharge is conducted in a reducing gas so that the copper wire is not oxidized. In this case, since no particular heating or the like is applied to the gas supplied, the temperature of the gas is at an ambient temperature or a temperature slightly higher than the ambient temperature by the effect of heat in the periphery. Accordingly, if the top end of the wire is melted by heating upon electric discharge, since the temperature of the blown gas is nearly at the ambient temperature, it acts to cool the molten wire by which impurities are tend to be involved to the inside to worsen the crystalline property. Further, the spherical portion (ball) molten into a spherical lump is rapidly cooled by the blowing of the gas after the electric discharge.

Since the ball has a high hardness in view of the above and can not be press-bonded sufficiently failing to obtain a necessary bonding area, or crackings are resulted to the silicon region or oxide layers under the wire bonding pad in a semiconductor pellet (chip) thereby reducing the bondability and worsening the reliability.

Further, in the prior art, the copper wire has been developed under the concept that the ball may be softened by reducing the hardness of the wire itself, and there has been paid no consideration for the relationship between the texture and the hardness of the ball, thus failing to obtain a sufficient reduction in the hardness of the ball.

The object of the present invention is to provide a highly reliable technique for copper ball bonding to an IC and LSI, as well as to provide information for the hardness and fine texture of a copper ball indispensable therefor.

Another object of the present invention is to provide a wire bonding technique causing less crackings.

A further object of the present invention is to provide a wire bonding technique with high reliability in the bonding.

These and other objects, as well as novel features of the present invention, will be apparent by reading the descriptions of the specification and the appended drawings.

Typical embodiments of the invention disclosed in the present application are briefly summarized as described below.

That is, the wire bonding device according to the present invention has an electric discharge electrode, which is opposed to the top of a wire projecting from the lower end of the capillary and causes electric discharge relative to the wire. Further, it also includes a gas supply means for supplying a reducing gas at a high temperature to the portion of the wire top end opposed to the discharge electrode. The high temperature reducing gas is at a high temperature from 100° to 200° C. and, preferably, from 150° C. to 200° C. and covers the top end of the wire. Further, the electric discharge is conducted in such a reducing gas atmosphere at high temperature, which is maintained at the high temperature at least till the ball formed by the electric discharge is hardened and then wire bonding is made.

According to the means as described above in the wire bonding of the present invention, since the sphericalization at the top end of the copper wire is conducted prior to the bonding in a reducing gas atmosphere at high temperature, the reducing effect is increased due to the high temperature to obtain a ball at high spherical shape of homogenous crystalline structure less involving impurities. Further, although the temperature of the ball is lowered upon stopping the electric discharge, since the temperature of the atmosphere in the electric discharging space is kept at 100° C.–200° C., the ball is gradually cooled. A ball at a high purity and low hardness can be obtained by the less incorporation of impurities and gradual cooling. Accordingly, the ball can be crushed sufficiently upon wire bonding to obtain a predetermined extent of bonding area to improve the bondability. Further, since the ball is softened more and it is adequately crushed to absorb stresses upon ball crushing, crackings less occur to the semiconductor matrix below the wire bonding pad. Further, by controlling the temperature for the ball-forming atmosphere to about 200° C. at the highest, wire bonding can be conducted satisfactorily with no such problems that the ball is softened excessively to be adhered with the capillary as the wire bonding tool thereby increasing the clogging or contamination in the capillary.

The present invention concerns a ball-bonded semiconductor device and, specifically, a semiconductor device in which an aluminum electrode on a semiconductor chip and a lead frame are connected and led out by means of copper bonding wires, wherein the hardness and texture of the copper ball are controlled as shown below.

(1) The hardness is less than 45 when measured by using a microvickers hardness tester manufactured by Shimazu under the condition of a 10 g load.

Figure 1:
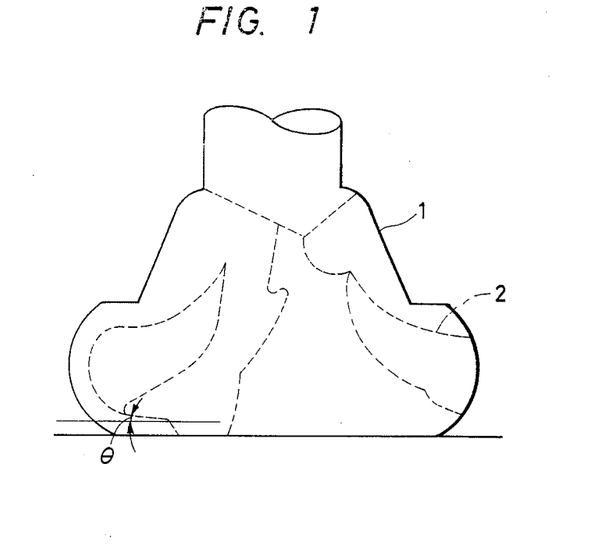
FIG. 1 is a schematic view illustrating the texture of the ball bonding portion in a semiconductor device according to the present invention.

(2) The copper ball is bonded under deformation such that at least one of crystal grains 2 at the periphery of the copper ball 1, just above the boundary at the bonded portion, makes an angle ($\theta$) of less than 30 degrees relative to the silicon (Si) chip in the junction between the copper ball and the aluminum electrode on the Si chip as shown in FIG. 1.

(3) The average crystal grain size is less than 15 $\mu$m, after polishing the texture of the copper ball at the boundary of the copper ball bonding substantially in parallel with the silicon chip and observed from above by a microscope.

In the case of applying the copper wire, it is joined to the aluminum electrode by means of ultrasonic vibrations. In this case, since the ball and the electrode film are rubbed with each other by the ultrasonic vibrations, oxide layers are removed from both of them to expose a fresh surface. Then, the fresh surface of both of them are bonded. However, since the copper ball is extremely hard and rubbed, fine cracks are liable to develop to the silicon chip itself thus bringing about a problem that the range of an adequate bonding condition is extremely narrow. Further, if they are bonded, since the ball is hard, the aluminum electrode layer comes out of the ball and the aluminum electrode is disconnected by corrosion at its thinned portion by the intrusion of moisture after the resin encapsulation.

In view of the above, it has been studied in various research organizations to reduce the hardness of the ball by improving the impurities of the copper wire and removing trace amount of impurity such as Fe, Au, etc. that may cause hardening to the ball, and the techniques for high purification have been studied.

Figure 3:
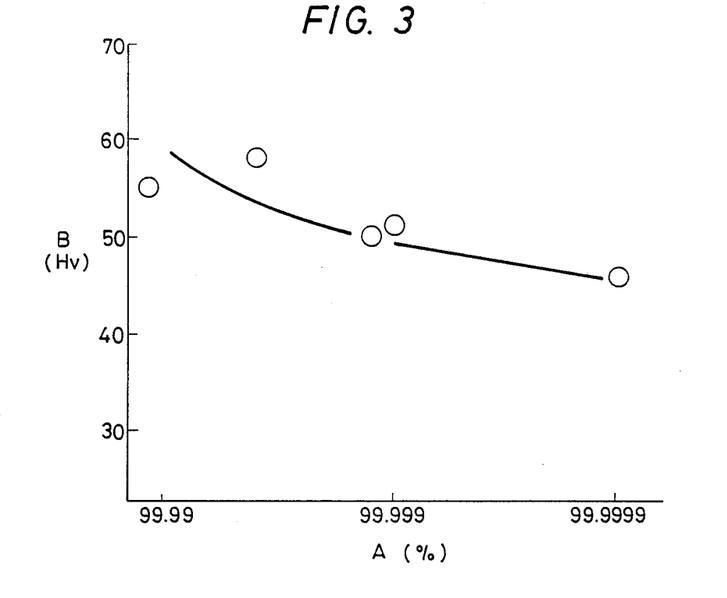
FIG. 3 is a graph showing a relationship between the hardness of a copper ball and a purity of a wire.

However, when the purity is improved from conventional 99.99% to 99.9999%, although hardness of the copper ball is softened till 99.999% the softening effect is saturated in excess thereof as shown in FIG. 3 failing to obtain sufficient effect for reducing the ball hardness In FIG. 3, the abscissa indicates a purity A (%) of the wire and the ordinate indicates the Vickers hardness (Hv) of the ball.

The object of the present invention for overcoming the foregoing problems is to provide information for the required hardness of the copper ball, the tissue of the ball capable of attaining such hardness, as well as the state of change in the crystal grains of the copper ball when subjected to the ball-bonding.

That is, it is intended in the present invention to use a copper wire at a purity of higher than 99.999% and control the coagulation rate upon forming a ball in an inert gas atmosphere comprising a mixture of non-oxidative gas such as argon and hydrogen, thereby controlling the texture, softening the ball and preventing the defective bonding.

It has been found that, when forming a copper ball by means of short-circuit discharge relative to an electrode, the ball is rapidly coagulated since the wire is as fine as several tens of micrometer and the ball diameter is also as small as less than 100 $\mu$m. That is, it has been found that the coagulated tissue of a ball becomes finer by the rapid cooling, the hardness of the ball is increased since impurities such as oxygen and hydrogen involved upon melting the wire can be released to the outside of the ball.

Figure 4:
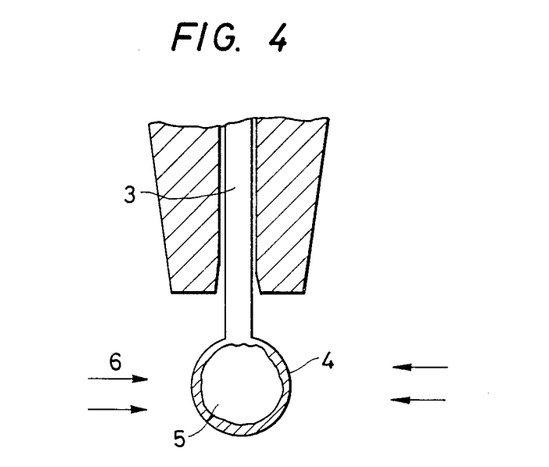
FIG. 4 is a schematic view illustrating the bonding method for a copper ball.

As shown in FIG. 4, ball coagulation starts from the wire portions 3 and the ball periphery 4 and proceeds to the central portion. Accordingly, impurities are tend to be segregated at in the central portion and less released to the outside. For lowering the ball coagulation rate, it is particularly effective to reduce the coagulation rate of the wire 3 and the ball 5. For that purpose, it is preferred to keep the wire 3 heated and form the ball in a heated non-oxidative gas such as an inert gas. An appropriate temperature of the gas is from 100° to 200° C. and, particularly, higher than 150° C.

Figure 5:
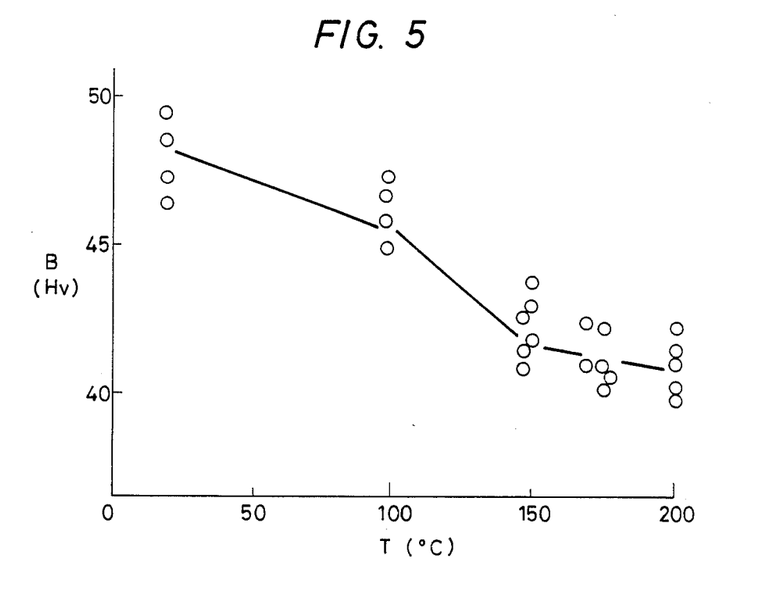
FIG. 5 is a graph showing a relationship between the temperature of a shield gas and the hardness of a ball.

FIG. 5 shows the trend of changes for the Vickers hardness (Hv) of the ball in relation with the shield gas temperature T(°C.) for the ball. As the heating temperature goes higher, the ball becomes softer and if the temperature is higher than 150° C., it is rather softened (about 6-7 Hv) as compared with the case of the room temperature. If the inert gas is heated to a temperature higher than 200° C., remarkable change is no more observed for the hardness. In FIG. 5, the temperature of the wire is set to 150° C. If the temperature of the wire is set to the room temperature, the Vickers hardness is increased by about 2 Hv. The temperature of the wire itself is also, preferably, from 100° to 200° C., for example, 150° C.

Figure 6:
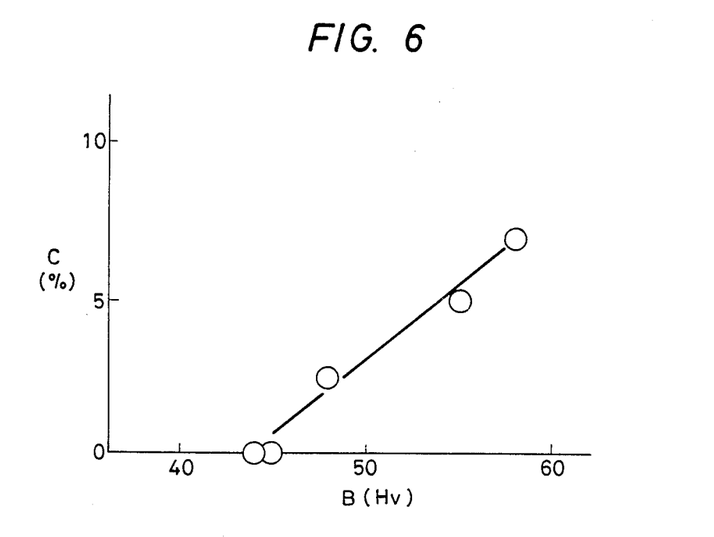
FIG. 6 is a graph showing a relationship between the hardness of a ball and silicon crack generation rate.

FIG. 6 shows the result for examining the change of crack generation frequency (%) in silicon upon ball bonding along by the Vickers hardness (Hv) of the ball. It can be seen from the figure, no silicon cracks are developed if the Vickers hardness is reduced below 45.

Figure 7:
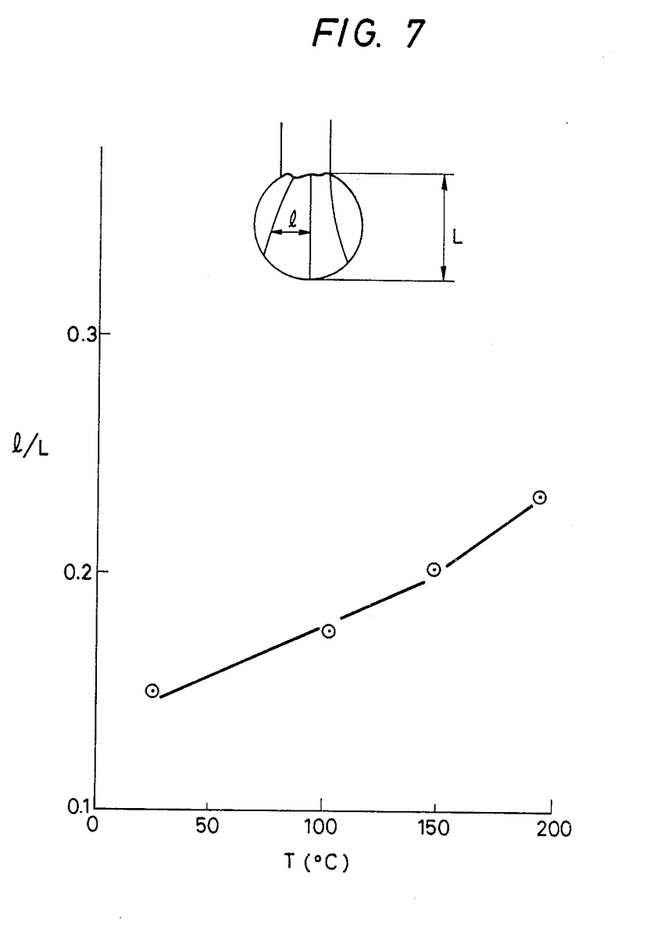
FIG. 7 is a graph showing a relationship between the average grain size and the temperature of the shield gas.

FIG. 7 shows the change of the average crystal grain size l/L of the ball having the cross sectional tissue of the ball as shown in the figure, depending on the temperature T(°C.) of the shield gas. The temperature of the copper wire near the copper ball is set to 150° C. in the case of FIG. 7. The grain size is increased as the temperature of the shield gas goes higher, because the coagulation rate is retarded by the use of the heated shield gas.

Figure 8:
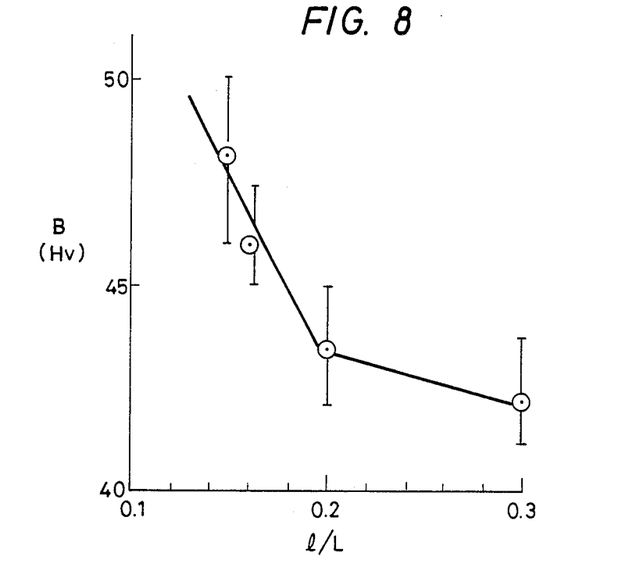
FIG. 8 is a graph showing a relationship between the average crystal grain size and the Vickers hardness of a ball.

FIG. 8 shows the relationship between the average crystal grain size l/l and the Vickers hardness (Hv) of the copper ball. It can be seen that if the average crystal grain size is greater than 0.2, the hardness of the copper ball does not exceed 45 and silicon cracks are no more developed upon ball bonding.

It has been thus found that if a Cu ball of an average crystal grain size of greater than 0.2 is used for ball bonding, at least one of crystal grain boundary at the periphery of the ball deforms plastically so as to form an angle ($\theta$) with the ball bonding face of less than 30 degrees upon deformation because of the soft texture.

FIG. 1 shows a schematic view when applying ball bonding using a copper ball with average crystal grain size l/l of 0.3. It can be seen that the $\theta$ is about 10 degrees.

While on the other hand, if a copper ball with the average grain size l/l of less than 0.2 is used for the ball bonding, since the ball is hard and no sufficient plastic flow occurs, the angle of the crystal grain boundary with the ball bonding face is inevitably increased. For instance, in the case if the average crystal size l/l is 0.16, the $\theta$ is 60 degree if the ball hardness is high.

Figure 2:
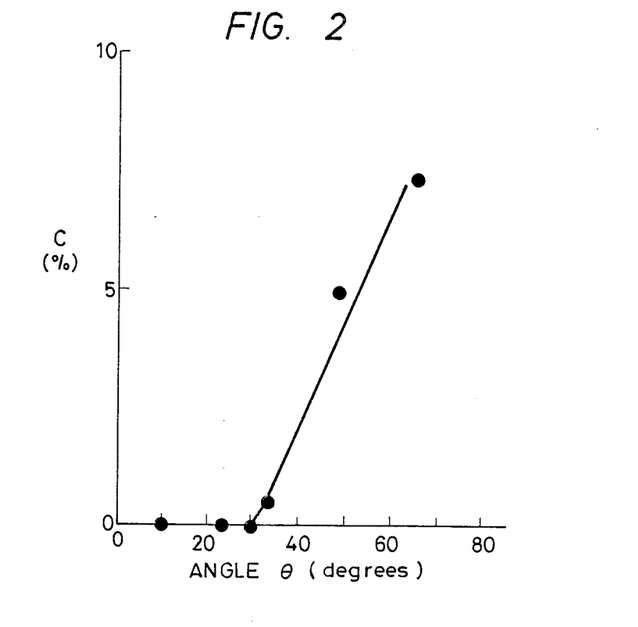
FIG. 2 is a graph showing a relationship between the angle $\theta$ formed by the crystal grain boundary of the ball bonding portion relative to the surface of a LSI chip and a crack generation ratio.

FIG. 2 shows the relationship between the angle $\theta$ (degree) of the crystal rain boundary relative to the bonding face in the conventional ball bonding and the silicon crack development ratio C (%). If the angle $\theta$ is exceeds 30 degree, silicon cracks are generated.

While on the other hand, the temperature for the Si chip is elevated to higher than 250° C. for promoting the deformation of the ball upon ball bonding. It has been found that a ball of a greater average crystal grain size and more soft tissue tends to cause recrystallization near the bonding boundary since less impurities are involved in the ball as compared with a ball of the smaller grain size and higher hardness.

In the case of applying bonding by using a ball of Vickers hardness at 50, the crystal grain size of the ball is apparently decreased as compared with the case of using a ball of Vickers hardness at 42 for the bonding.

Figure 9:
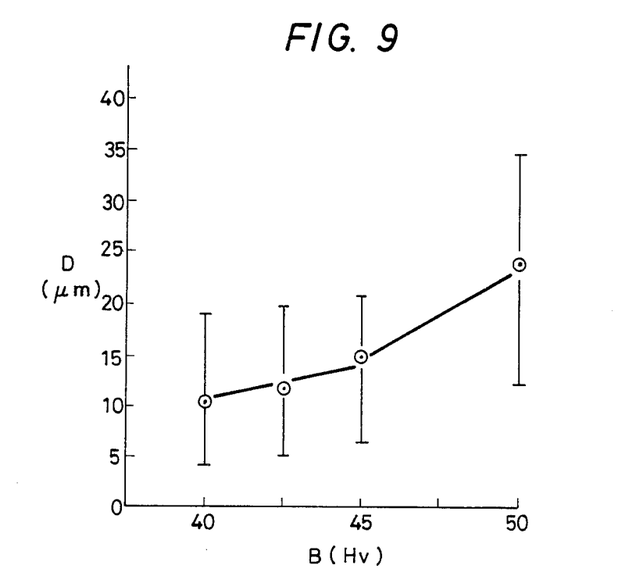
FIG. 9 is a graph showing a relationship between the hardness of a ball and the crystal grain size at a ball bonding portion.

FIG. 9 shows the relationship between the Vickers hardness B (Hv) of a ball and the average grain size after the ball bonding.

In FIG. 9, the crystal grain size D ($\mu$m) of a copper ball at the ball bonding portion using a copper wire when observed from above by a microscope is shown along the ordinate as the average crystal grain size after the ball bonding. The object observed from the above is the ball tissue of a bonding wire within the range of a height 30 $\mu$m above the bonded boundary where the wire is bonded to the bonding pad of the semiconductor pellet, which is polished in parallel with the surface of the semiconductor pellet.

It can be seen that the average value for the grain size is less than 15 $\mu$m in the case of the Vickers hardness is less than 45. That is, the defective bonding can be prevented by reducing the average crystal grain size to less than 15 $\mu$m.

DESCRIPTION OF THE PREFERRED EMBODIMENTS

Example 1

Description will be made to one embodiment of the present invention referring to the drawings.

Figure 10:
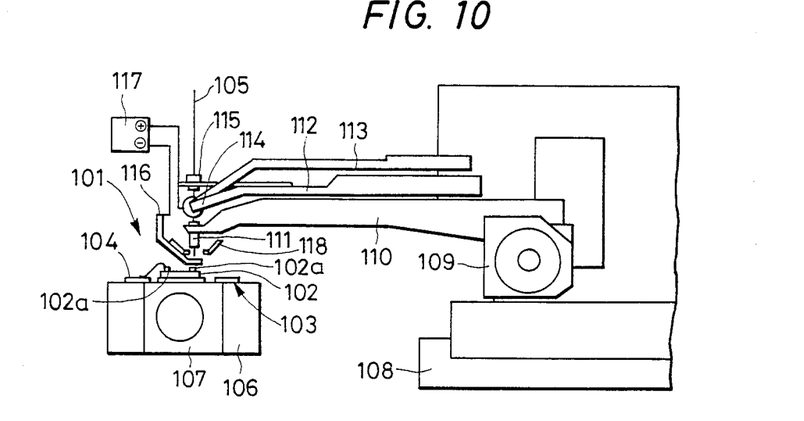
FIG. 10 is a front elevational view illustrating a portion of a wire bonding device in one embodiment according to the present invention.
Figure 11:
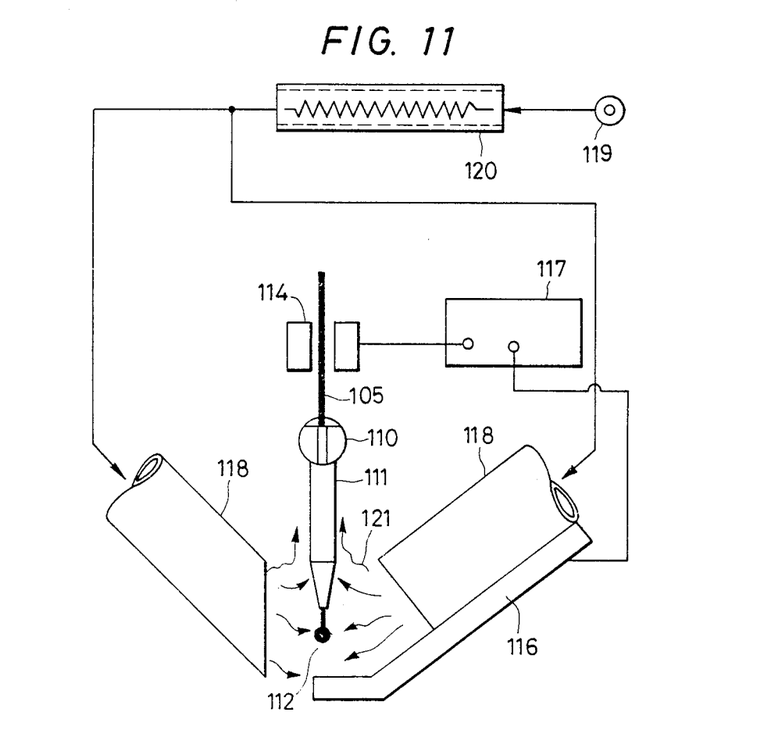
FIG. 11 is a schematic view illustrating the state of forming a ball.
Figure 12:
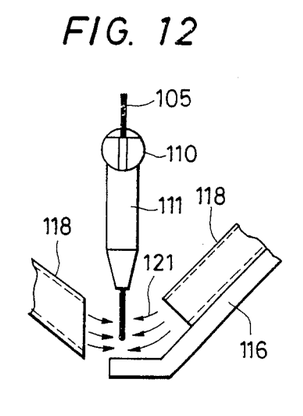
FIG. 12 is a schematic view illustrating the top end of a wire before the initiation of the electric discharges.
Figure 13:
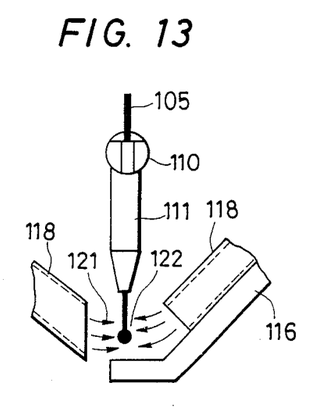
FIG. 13 is a schematic view illustrating the state where the top end of the wire is sphericalized by the electric discharge.
Figure 14:
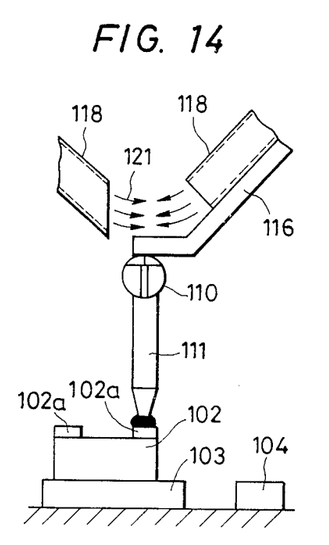
FIG. 14 is a schematic view illustrating a state where the top end of the wire is settled to the first bonding point.
Figure 15:
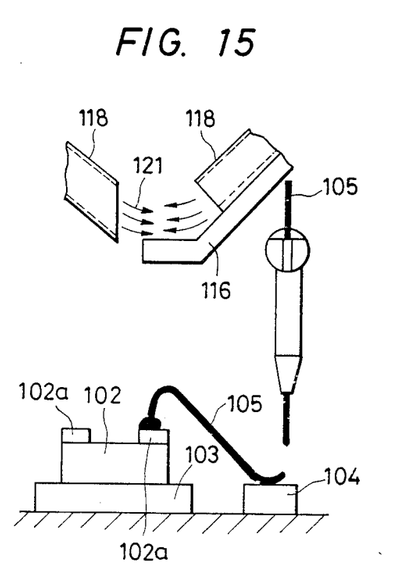
FIG. 15 is a schematic view illustrating a state where the top end of the wire is settled to the second bonding point.

FIG. 10 is a front elevational view showing a portion of a ball bonding type wire bonding device in one embodiment according to the present invention, FIG. 11 is a schematic view illustrating the ball-forming state, FIG. 12–FIG. 15 are schematic views illustating the ball-forming steps, in which FIG. 12 is a schematic view illustrating the top end of a wire before starting the electric discharging, FIG. 13 is a schematic view illustrating the top end of the wire sphericalized by the electric discharge, FIG. 14 is a schematic view showing the state in which the top end of the wire is secured to the first bonding point, FIG. 15 is a schematic view showing the state in which the top end of the wire is secured to the second bonding point and FIG. 5 is a graph showing a correlationship between the temperature for the ball-forming atmosphere and the ball hardness.

In the wire bonding device of this embodiment, as shown in FIG. 10, a semiconductor pellet 102 in which a not-completed semiconductor device 101, that is, semiconductor integrated ccircuits such as IC or LSI or transistors such as MOSFETs or bi polar transistors are formed into a semiconductor pellet and each of leads of a lead frame 103 are electrically connected by bonding the electrode (wire bonding pad) 102a of the semiconductor pellet 102 and the leads 104 of the lead frame 103. The wire bonding device has a feeder 106 equipped with a heater block 107 capable of heating the lead frame 103. An X-Y table 108 is disposed to the outside of the feeder 106 so as to be displaceable in X-Y direction and a bonding head 109 is mounted on the X-Y table 108. A bonding arm 110 is rotatably pivoted at the base end thereof on the bonding head 109, and the bonding arm 110 is so adapted to be driven by a cam mechanism (not illustrated) such that a capillary 111 connected as a wire bonding tool to the top end thereof is moved vertically. The bonding arm 110 is connected with an ultrasonic vibration source and an ultrasonic vibration horn not illustrated so that ultrasonic vibrations are transmitted by means of the bonding arm to the capillary as the connection tool, so as to conduct bonding by means of supersonic vibrations or press bonding under heating combined with supersonic vibrations. A pair of clamp arms 112 and 113 are disposed on the upper side of the bonding arm 110 such that they are actuated by an adequate means such as solenoid plunger mechanism (not illustrated) and the respective ends of both of the clamp arms 112 and 113 are situated just above the capillary 111 to constitute a clamper 114. A copper wire 105 as a bonding wire delivered from a reel (not illustrated) is inserted by way of a guide 115 and further inserted through the capillary 111.

A discharge electrode 116 is disposed in the vicinity of and separately from the capillary 111 and the discharge electrode 116 is rotatably pivoted at the upper end thereof such that the top end displaces between the position below the capillary 111, that is, the position just beneath the top end of the wire 105 and the side position (retracting position) to the capillary 111. A power source circuit 117 is connected between the discharge electrode 116 and the clamper 114 to apply a voltage (about 1000 volt, several tens of milliamperes—several amperes) between the clamper 114, that is, the wire 105 inserted therethrough and the discharge electrode 116. In this case, the electric discharge fabrication can be carried out preferably for the ball when the top end of the wire is connected to the anode while the discharge electrode is connected to the cathode of the power source. As a result, electric discharge arc is generated between the wire 105 and the discharge electrode 116, by which the top end of the wire 105 is melted and sphericalized by the surface tension.

While on the other hand, a plurality of tubes 118 as means for supplying a gas to the top end of the wire 105 are disposed in this wire bonding device. A plurality of tubes 118 are disposed radially such that their openings are directed to a position below the capillary 111 and opposed with each other. Further, several of the tubes 118 are disposed along the upper surface of the discharge electrode 116 so that a reducing gas may be supplied to the region on the upper surface of the discharge electrode 116. Further, a gas source 119 for the reducing gas, for example, a gas mixture of an inert gas such as a nitrogen gas and a hydrogen gas is connected to the rear end of the tube 118 and an electric heater 120 as heating means is disposed at the midway of the tube so that the gas can be heated to a predetermined temperature. As described later, the reducing gas 121 is supplied under heating to a temperature from 100° C. to 200° C. by the electric heater 120. As a result, when the gas is jetted out from the top end of the tube 118, the top end of the wire is surrounded with the reducing gas at high temperature.

Description will be made specifically to the wire bonding method by such a wire bonding device and a production process for a semiconductor device.

When the lead frame 103 to which the semiconductor pellet 102 is bonded is supplied to a bonding stage on the feeder 106, the X-Y table 108 is displaced properly such that the lower end of the wire 105 held by the capillary 111 is opposed above the discharge electrode 106 as shown in FIG. 12. In this state, the lower end of the wire 105 mainly composed of copper is placed in the reducing gas atmosphere formed by a gas blown out from the tubes 118 respectively as shown in FIG. 11 through FIG. 13. Further, the reducing gas atmosphere is formed by the reducing gas 121 heated by the electric heater 120. The temperature for the reducing gas atmosphere is kept within a range from 100° C. to 200° C. and, preferably, from 150° C. to 200° C., which is based on the finding that if the temperature for the reducing gas high upon sphericalization of the wire top end, the top end does not involve impurities and the hardness thereof is lowered to improve the bonding property. It has, however, been also found that if the temperature is excessively high, the wire is adhered to the capillary, failing to conduct wire bonding. The hardness of the ball varies depending on the temperature for ball-forming atmosphere and it has been found by the experiment made by the present inventors that the hardness changes as shown by the graph in FIG. 5. That is, FIG. 5 shows the temperature T(°C.) for the ball-forming atmosphere, that is, shield gas on the abscissa and the Vickers hardness (Hv) of the ball on the ordinate. As can be seen from the graph, the Vickers hardness of the ball is rapidly lowered if the temperature for the reducing gas exceeds 100° C. and such a hardness lowering effect is substantially saturated as the temperature exceeds 200° C. If the temperature for the shield gas is higher the 200° C., the bonding wire is adhered to the capillary (bonding tool) to cause clogging or contamination thereto, bringing about a difficulty in continuing the bonding operation. Accordingly, the temperature for the shield gas atomosphere upon ball-forming is desireably from 100° C. to 200° C. The temperature range for the shield gas atmosphere upon ball-forming is, particularly preferably, from 150° to 200° C. for forming a ball at high purity with less incorporation of impurity, obtaining a predetermined crushing amount by the press-bonding of the ball and increasing the bonding strength.

Then, when the discharge electrode 116 is brought closer to the lower end of the copper wire 105, the power source circuit 117 is closed and a voltage is applied between the lower end of the wire 105 and discharge electrode 116. As a result, a discharge arc is generated between the top end of the wire 115 and discharge electrode 116 to conduct electric discharge, by which a ball 122 is formed by melting at the top end of the copper wire 105 as shown in FIG. 13. Since the ball 122 is formed under the reducing gas atmosphere (shield gas) at high temperature, a pure ball can be obtained with less incorporation of oxides. Further, since there is no oxide layers on the surface, the surface tension is exerted over the entire area of thed sphere to sphericalize the ball. Further, the hardness of the ball is lower than 50 (Hv)..

Then, as the bonding head 10 is displaced, the capillary 111 aparts from the discharge electrode 116 and moves to the first bonding point. Since the capillary 111 descends at the first bonding point, the ball 122 at the top end of the wire 105 is crushed by the capillary 111 and then press-bonded to the electrode (wire bonding pad mainly composed of aluminum) of the pellet 112. In this instance, since the pellet 102 is heated by the heat block 107 and since the capillary 111 undergoes ultrasonic vibrations, the ball 122 is press-bonded under heating on the pad of the pellet 102 as shown in FIG. 14.

The wire bonding is carried out by the press-ball bonding under heating in combination with ultrasonic vibrations. Referring more specifically to the temperature, the heating temperature at the pellet bonding portion when the pellet 102 is heated by the heat block 107 is about from 330° C. to 350° C. Further, in the press-bonding system under heating combined with ultrasonic vibrations, the temperature of the capillary 111 is elevated to about 130° -140° C. during operation of the capillary. The temperature of the capillary 111 in the case of the press bonding system under heating is controlled positively to 180° C.±10° C.

After the completion of the first bonding, the capillary 111 is moved relatively in a 3-dimensional manner by means of the X-Y table 108 and the bonding head 109, transferred above a predetermined lead 104 as the second bonding point and then descended. As the capillary 111 descends and undergoes ultrasonic vibrations at the descended position, the wire 105 is press-bonded under heating onto the lead 104 also being assisted by the heating of the lead 104 from the heat block 7. The wire bonding is also conducted by the press-bonding system under heating combined with ultrasonic vibrations as in the first bonding.

After the completion of the second bonding, the clamper 114 grips the wire 105. Since the clamper 114 then uprises together with the capillary 111, the wire 105 is disconnected from the second bonding portion. Then, when the clamper 115 releases the wire 105, the capillary 114 uprises slightly. By the tail-exposing operation for the wire, the top end of the wire 105 is protruded by a length required for the formation of ball 122.

The wire bonding is completed by connecting the first bonding point on the pellet 102 and the top ends of the respective leads 104 as the second bonding point on the lead frame 103 by means of the wire 104 successively by repeating the foregoing procedures.

Figure 16:
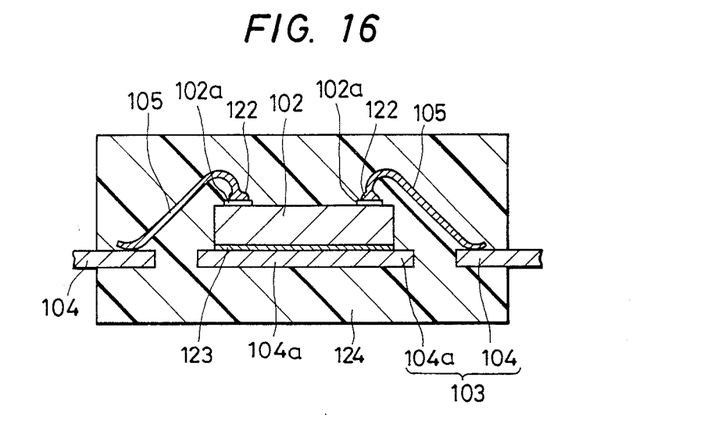
FIG. 16 is a cross sectional view illustrating a semiconductor device for one embodiment according to the present invention.

As shown in FIG. 16, the semiconductor pellet (chip) 102 is secured by means of adhesives 123 such as silver paste (pellet-bonded) to the lead frame 103, that is, the tab 104a as the pellet mounting region of the lead frame 103 after completion of the wire bonding, and the bonding pads 102a of the semiconductor pellet 102 and the inner lead of the outer leads 104 of the lead frame 103 are connected with each other by means of the bonding wire 105.

Then, the lead frame 103 after the completion of the wire bonding is set to a transfer molding machine to apply resin encapsulation by using a mold resin thereby encapsulating the semiconductor pellet 102, etc. and conducting pacckaging. In the figure, 124 denotes a mold resion encapsulation body. Then, frame portions, etc. of the lead frame 103 which are no more necessary as the semiconductor device products are removed by cutting and the outer leads 104 are bent as required thereby obtaining a completed semiconductor device.

In this embodiment, a copper wire is used as the wire 105 for the wire bonding. Copper is readily oxidized and relatively hard. Accordingly, if ozide layers are formed to the surface of the wire during melting upon sphericalizing the top end of the copper wire by melting, the melting occurs not uniformly thus making the shape of the ball not suitable. Such an undesired shape of the ball makes the press bonding area not uniform to worsen the bonding reliability and causes defective press-bonding if the area of the press bonding is small. Further, if oxide layers are formed at the surface of the ball, the metal bondability of the bonding pad with aluminum is lowered. Further, if the ball is hard, the ball crushing amount upon press-bonding under heating is decreased and the shape is worsened as well. Further, if the ball is hard, it no more absorbs press-bonding force, to exert an excess force to silicon (semiconductor) material beneath the pad thereby resulting in cracks, etc., or the like to reduce the yield.

However, in this embodiment, since the ball 122 of the copper wire 105 is formed in a reducing gas atmosphere at high temperature, no oxide layers formed on the surface during melting and no impurities such as oxide are involved to the inside thereof. As a result, since the top end of the copper wire 105 is melted for the inside and the entire surface, uniform surface tension is generated to form the ball 122 of high sphericalness.

In the conventional case in which the reducing gas is not heated, since the molten ball 122 is hardened by the surrounding atmosphere, the hardness is increased. While on the other hand, in this embodiment, since the ball placed in the atmosphere at 100°–200° C., the cooling rate of the ball is moderated to reduce the hardness of the ball.

According to the embodiment as described above, the following advantageous effects can be obtained.

(1) In the wire bonding according to the present invention, upon melting to form a ball at the top end of the wire by electric discharge arc, since the top end of the wire is placed in the reducing gas atmosphere at high temperature and discharge is conducted in that state, neither the impurities are involved to the inside of the ball nor the oxide layers are formed at the surface thereof and, accordingly, a ball at high purity can be formed.

(2) Since the ball at high purity can be formed as described in (1) according to the present incvention, the sphericalness of the ball is also improved.

(3) Since the sphericalness of the ball is improved as described in (2) above by the wire bonding according to the present invention, the ball is crushed uniformly and the press-bonded portion of the ball does not go beyond the pad.

(4) Since the sphericalized top end of the wire is put within the atmosphere at a high temperature of from 100° to 200° C. in the wire bonding according to the present invention, hardening occurs gradually to reduce the hardness of the ball.

(5) Since a ball of a low hardness and easily crushable can be formed as described in (1) and (4) above, in the wire bonding according to the present invention, the ball can be crushed as desired upon being press-bonded under heating to the pad and, accordingly, an expected bonding area can be obtained to attain a wire bonding at high bonding strength.

(6) Since the hardness of the ball is not excessive in the wire bonding according to the present invention as described in (5) above, the ball absorbs the bonding force by crushing upon press-bonding under heating to the pad, thereby causing no cracking to the semiconductor placed beneath the pad.

(7) Since the bondability with the pad is satisfactory and the semiconductor device forming region, etc. beneath the pad is not injured in the wire bonding according to the present invention as described in (5) and (6) above, the bonding reliability can be improved and the yield is increased in the wire bonding according to the present invention.

(8) While the top end of the wire is heated upon sphericalization in the wire bonding according to the present invention, since the heating does not cause adhension of the ball to the capillary or contamination of the capillary, the wire bonding can be executed smoothly to thereby improve the productivity.

(9) A synergistic effect of providing a wire bonding technique of high yield and high wire bonding reliability can be obtained according to the present invention by the effects (1)-(8) described above.

Although the invention made by the present inventor has been described specifically referring to the embodiment, the invention is no way limited only to such an embodiment but can be modified variously within a range not departing from the scope of the invention. For instance, the high temperature gas supplied to the top end of the wire is not restricted only to the reducing gas but similar effect in that embodiment can be obtained with a non-oxidative gas such as an inert gas. Further, the wire is not restricted only to those wires mainly composed of copper but those wires mainly made of aluminum, gold wire, silver wire may also be used.

Although the explanation has been made mainly to the case of applying the invention in the wire bonding technique utilizing the press-bonding under heating combined with ultrasonic vibrations, which is the background art for the present invention, the present invention is no way limited only thereto, and is also applicable to wire bonding for press-bonding system under heating.

The present invention is applicable at least to the ball bonding techniques in which easily oxidizable bonding wire is connected by sphericalization.

EXAMPLE 2

Description will be made to Example 2 of the present invention.

The IC applied with the ball bonding according to the present invention has such a structure in which a copper wire of 30 μm diameter is bonded at its ball portion to an aluminum alloy electrode mainly composed of aluminum, while the other end of the wire is ball-bonded to a Cu-plated lead frame on a silicon chip.

Table 1 shows the result of the reiliability test conducted after resin encapsulation for the ICs described above. If cracks are resulted to silicon chips, they are developed to cause failures in the temperature cycle test. Further, if an aluminum alloy electrode goes beyond the encapsulation, corrosive disconnection to the aluminum layers is liable to occur in the PCT (pressure cooker test). No defects occur in the LSIs according to the present invention to provide satisfactory results in either of the tests.

TABLE 1

| Reliability of Resin Encapsulated IC | | |
|---|---|---|
| Test item | Test condition | Number of defects |
| Temperature cycle | −65° C. +150° C. 30 min, 2K cycle | 0/200 |
| Heat shock | −65° C. +150° C. 5 min, 500 cycle | 0/200 |
| Leaving at high temperature | 150° C. 2000Hh | 0/200 |
| PCT | 121° C. 2 1000 hr | 0/200 |
| Leaving at high temperature and high humidity | 65° C. 85% RH 2000 hr | 0/200 |
| High temperature, high humidity bias | 85° C., 85% RH 15 V 2000 hr | 0/200 |

As has been described above according to the present invention, since the occurrence of defects can be prevented upon ball bonding, it is possible to conduct highly reliable ball bonding by using a copper wire.

EXAMPLE 3

In the conventional wire bonding device, no consideration was made for the bonding property and for safety regarding the hydrogen content in the reducing gas. Then, it has been found by the present inventors that as the hydrogen content in the reducing gas increases, the hardness of the ball formed in the reducing gas is increased to lower the bonding property and, as a result, and excess deforming force is applied to the ball, which exerts large stresses to silicon material beneath the bonding pad of the semiconductor device thereby often causing bonding damage or cracks.

Further, in the case where hydrogen in the reducing gas used in such a wire bonding device is released to the atmosphere, and if the mixing ratio between air and hydrogen exceeds 4% (by volume) even locally, ignition may possibly occur by the discharge sparks upon forming the ball, etc. functioning as an ignition source.

Accordingly, the principal object of this embodiment is to provide a wire bonding technique capable of providing satisfactory bondability and working safety.

In this embodiment, a wire bonding technique is proposed in which gas supply means capable of supplying a mixture containing less than 4% (by volume) of hydrogen is supplied to the surrounding of the works.

When the reducing gas is supplied to the surrounding of the discharging portion with an aim of preventing the oxidation of a ball upon forming the ball and reducing the oxides if contained in the ball, if the hydrogen contents is excessive, the amount of hydrogen incorporated to the grain boundary of the ball (hydrogen involved to the inside of the ball upon forming the ball by discharge melting) is increased to increase the ball hardness.

However, according to the means as described above, since the hydrogen contant is set to less than 4% (by volume), which is the critical value for increasing the ball hardness, increase in the ball hardness can be prevented.

Furthermore, even in a case where the reducing gas should be released to the atmosphere, if the hydrogen content in the reducing gas is less than 4%, the mixing ratio with air is naturally reduced to less than 4% and there is no worry of ignition even if there is an ignition there is not worry of ignition even if there is an ignition source in the vicinity thereof.

Figure 17:
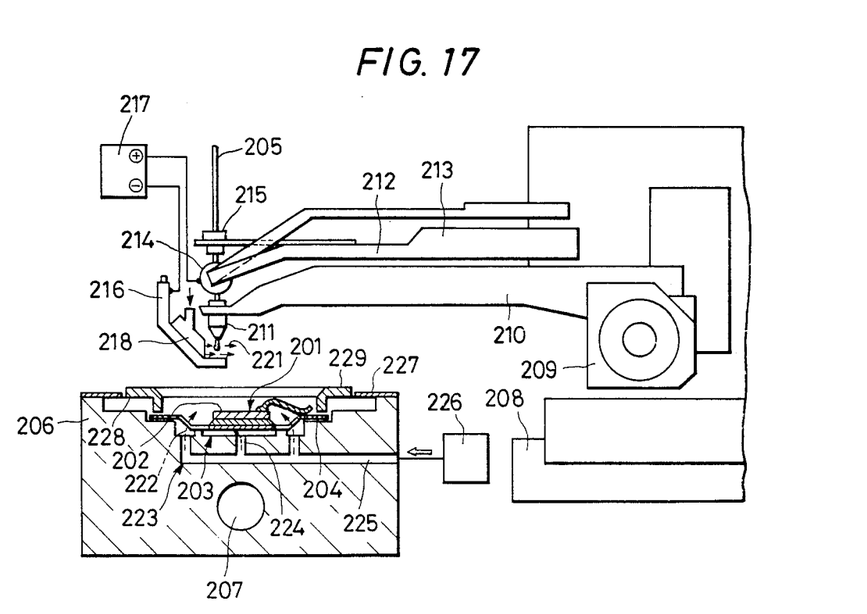
FIG. 17 is a front elevational view illustrating a wire bonding device for another embodiment according to the present invention.
Figure 18:
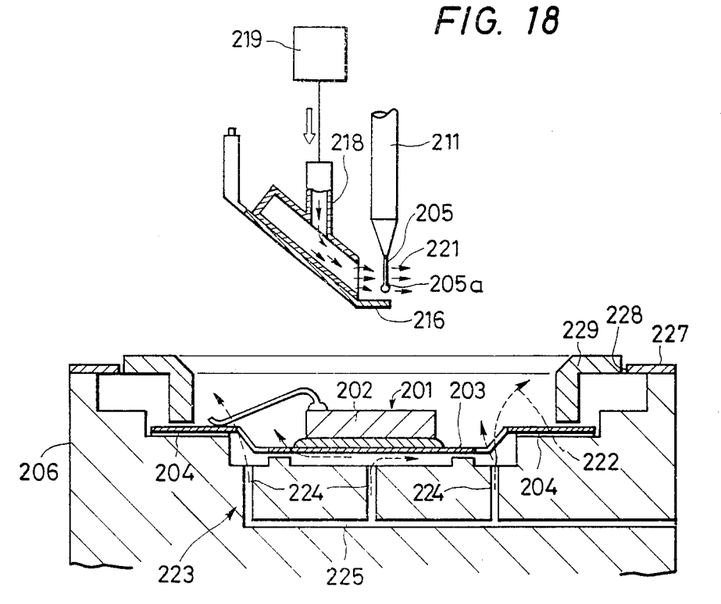
FIG. 18 is an enlarged front elevational view for a portion thereof.
Figure 19:
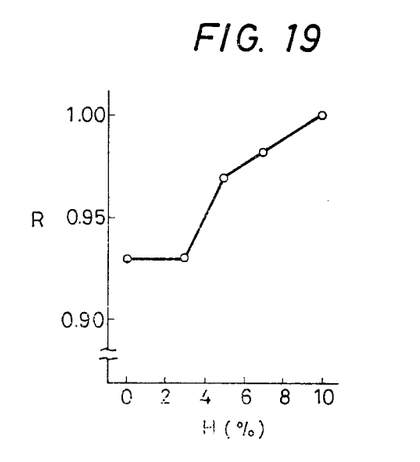
FIG. 19 is a block diagram for illustrating the operation thereof.

FIG. 17 shows a front elevational view wire for the bonding as in example 3 of the present invention, FIG. 18 is an enlarged front elevational view for a portion thereof and FIG. 19 is a graph for explanating the operation thereof.

The wire bonding device in this embodiment is adapted such that the pellet 202 of a semiconductor device 201 and leads 204 of a lead frame 203 are connected electrically by bonding the bonding pads of the pellet 202 and the leads 204 of the lead frame 203 with the wire 205 respectively. Accordingly, the lead frame 203 on which the pellet 202 is mounted and the wire 205 substantially constitutes a work in this embodiment.

The wire bonding device comprises a feeder 206, which is equipped with a heat block 207 for heating the lead frame 203. An X-Y table 208 is disposed to the outside of the bonding stage on feeder 206 so as to be displaceable in X-Y direction and a bonding head 209 is mounted on the X-Y table 208. A bonding arm 210 is rotatably pivoted at the base end thereof on the bonding head 209, and the bonding arm 210 is so adapted to be driven by a cam mechanism (not illustrated) such that a capillary 211 secured at the top end thereof is moved vertically. The bonding head 209 is connected with an ultrasonic vibration device (not shown) for putting the capillary 211 to ultrasonic vibrations by way of the bonding arm 210.

A pair of clamp arms 212 and 213 are disposed on the upper side of the bonding arm 210 such that they are actuated by an adequate means, e.g., solenoid plunger mechanisms (not illustrated) and the respective ends of both of the arms 212 and 213 are situated just above the capillary 211 to constitute a clamper 214. A copper wire 215 delivered from a reel (not illustrated) is inserted through the clamper 214 by way of a guide 215 and further inserted into the capillary 211. A discharge electrode 216 is disposed in the vicinity of and separately from the capillary 211 and the electrode 216 is rotatably pivoted at the upper end thereof such that the top end displaces between the position below the capillary 211, that is, the position just beneath the top end of the wire 105 and the side position (retracting position) to the capillary 211. A power source circuit 217 is connected between the discharge electrode 116 and the clamper 214 to cause a discharge arc between the electrode 216 and the wire 205.

The wire bonding device comprises tubes 218 for forming a gas atmosphere by supplying a gas to the periphery of a ball formed at the top end of the wire 205 and the tubes 218 as the gas supply means are attached to the discharge electrode 216 with the tube openings being directed to a position below the capillary 211. A gas supply unit 219 for supplying a reducing gas such as a gas mixture of a non-oxidative gas such as argon gas and hydrogen gas is connected to the tubes 218, and the unit 219 is controlled such that the hydrogen content in the reducing gas supplied is of about 3%. A heater 220 as the gas heating means is inserted by way of insulation tapes to the inside of the tubes 218. The heater 220 is adapted such that it can control the reducing gas supplied from the gas supply unit 19 (hereinafter referred to as shield gas or ball-forming gas) 221 to a predetermined temperature by heating during passage of the gas through the tube 218 and the heat block 220.

While on the other hand, a reducing gas supply device 223 is disposed to the bottom of the feeder 206 for supplying the reducing gas 222 for preventing the oxidation of the lead frame 203 (hereinafter referred to lead frame oxidation preventive gas) and the supply device 223 has blowing ports 224. A plurality of blowing ports 224 are disposed at the upper surface of the feeder 205 so that the lead frame oxidation preventive gas 222 can be blown out moderately to the periphery of the lead frame 203. A gas supply channel 225 is connected to the group of the blowing ports 224. The gas supply channel 225 is connected with a gas supply unit 226, which is constituted such that it can supply a reducing gas, for example, a gas mixture comprising a non-oxidative gas such as nitrogen and hydrogen at a predetermined flow rate. Further, the unit 226 is also controlled such that the hydrogen content in the lead frame oxidation preventive gas supplied is less than 4% (by volume).

A cover 227 is disposed over the feeder 206 so as to substantially cover the entire lead frame 203 and cover 227 functions to hold the oxidation preventive gas 222 supplied to the periphery of the lead frame 203 as long as possible to the periphery of the frame 203. A window 228 is perforated to the cover 227 at the position corresponding to the bonding stage just beneath the capillary 211 in such a substantially square shape as capable of conducting the wire bonding. A lead frame retainer 229 formed substantially as a square frame is elevatably fitted to the window 228 and the retainer 229 is made vertically movable interlocking with the intermittent operation of the feeder 206 by means of an appropriate driving device such as cam mechanisms (not illustrate). That is, the retainer 229 is adapted to prevent the loose movement of the lead frame 203 by retaining the lead frame 203 upon practicing the wire bonding.

Then, the operation of the wire bonding device having constitution as described above will be explained.

When the lead frame 203 as a work bonded with the pellet 202 is intermittently supplied by the feeder 206 and the portion of the pellet 202 to be wire-bonded is supplied to the bonding stage in the feeder 206, the lead frame retainer 229 is descended within the window 28 to retain the lead frame 203. Subsequently, the X-Y table 208 is properly moved so as to repeat the bonding operations as described later.

While on the other hand, in the capillary 211, when the discharge electrode 216 is brought closer with the lower end of the copper wire 5 and the power source circuit 207 is closed, a ball 205a is formed by melting at the top end of the copper wire 205. In this case, a reducing gas 221 controlled to about 3% hydrogen content is supplied from the tube 218 to maintain the reducing gas atmosphere between the wire 205 and the electrode 216. Since the reducing gas 221 is put to heating control such that it is at a predetermined temperature by the heater 220 disposed to the midway in the inside of the tube 218, the gas atmosphere is kept within a predetermined temperature range to prevent the lowering of the temperature for the ball 205a formed at the top end of the wire 205. As a result, if the reducing gas 221 is blown to the molten ball 205a, the hardness of the ball 205a is not reduced.

Then, the capillary 211 is descended by the bonding head 209 to gradually press-bond the ball 205a formed at the top end of the wire 205 to the pad of the pellet 202. Since the pellet 202 is heated by the heat block 207, the ball 205a is bonded to the pad of the pellet 202 by means of the press-bonding under heating combined with ultrasonic vibrations. Then, since the hydrogen content in the gas atmosphere is kept to about 3%, the ball 205a is kept from hardening as described later and, accordingly, can be heat-bonded with satisfactory bondability.

By the way, it has been found by the present inventor that if the hydrogen content in the ball-forming gas (shield gas) is greater, since the amount of hydrogen molecules involved into the grain boundary of the ball 205a formed by melting to the top end of the copper wire 205 is increased and the ball hardness is increased, there has been a problem that the bondability is reduced at the first bonding.

In view of the above, according to this embodiment, the hydrogen content in the ball-forming gas 221 is to suppressed to about 3% thereby reducing the amount of hydrogen involved in the grain boundary of the ball 205a formed by melting and preventing to increase in the ball hardness. As a result, since the increase of the ball hardness can effectively be prevented, coupled with the prevention of the temperature lowering caused by the blowing of the reducing gas 221 by means of preheating the reducing gas 221, bondability at the first bonding can be improved.

FIG. 19 is a graph illustrating the relationship between the hydrogen content in the ball-forming gas and the hardness of the ball formed in the gas atmosphere. The abscissa indicates the hydrogen ratio H (vol %) contained in the ball-forming gas, while the ordinate indicates the hardness of the ball formed in the gas atmosphere at such a content by the hardness ratio R assuming the hardness of the ball as "1" when it is formed in a gas with 10% hydrogen content. The copper wire used is made of copper of 99.999% purity and the ball is formed into 80 $\mu$m diameter. Further, the hardness is measured under the room temperature by using a microvickers hardness tester.

According to FIG. 19, if the content of hydrogen in the ball-forming gas exceeds 3%, the ball hardness is increased. Accordingly, the ratio of hydrogen contained in the ball-forming gas 221 is set to about 3% in this embodiment.

After the formation of the first bonding portion, the capillary 211 is relatively moved in a three dimensional manner by means of the X-Y table 8 and the bonding head 209 and an intermediate portion of the wire 205 is urged to secure to a predetermined lead 204. Since the ultrasonic vibrations are applied to the capillary 210 and the lead 204 is heated by the heat block 7, the wire 205 is bonded on the lead 204 by the press bonding system under heating combined with ultrasonic vibrations.

After the completion of the second bonding, the clamper 214 grips the wire 205 and the clamper 214 is moved together with the capillary 211 apart from the second bonding. By the separating movement, the wire 205 is disconnected from the second bonding portion. Then, when the clamper 24 releases the wire 205 and the capillary 211 rises slightly, the top end of the wire 205 is protruded for a length required for forming the ball 205a and tail-exposing operation is conducted.

Subsequently, the foregoing operations are repeated by the cycle corresponding to the number of the bonding pad and the inner leads 204 in the pellet 202 to conduct required wire bonding operation. Then, when the wire bonding work has been completed for the one unit lead frame, the retainer tool 229 is moved upwardly and the lead frame 203 is sent by one pitch such that the next pellet 202 is situated to the bonding stage. Thereafter, the wire bonding operations as described above are successively conducted for the pellet 202 for each of the units.

During the bonding operation, since the lead frame oxidation preventive reducing gas 222 is always blown out from the blowing ports 224 disposed to the upper surface of the feeder 206, the lead frame 203 is immersed within the reducing atmosphere. In this case, since the reducing gas atmosphere is covered with the cover 227 laid over the feeder 206, the reducing gas 222 can effectively surround the lead frame 203 and the pellet 202. Accordingly, oxidation of the lead frame 203, etc. can surely be prevented.

In a case where the copper type lead frame is used as for the lead frame, since the copper is easily oxidizable and oxide layers are formed thickly on the bonding surface, the bondability at the second bonding is reduced. That is, if the oxide layers are formed, since the metal bondability with the wire is reduced, the bondability is also worsened.

However, in the present invention, since the cover 227 covers over the feeder 206 and the frame 203 is surrounded with the reducing gas atmosphere supplied to the inside thereof, no oxide layers are formed at the surface of the oxidizable copper type lead frame if it is used and, as a result, the wire 205 can be bonded on the lead 204 with satisfactory bondability.

By the way, since the lead frame oxidation preventive reducing gas 222 contains hydrogen, if the gas escapes from the cover 227 and is brought into contact with an oxygen atmosphere, it may be ignited to cause burning in the presence of arc of the discharge electrode 226, etc. as an ignition source. Then, it has been found by the present inventor that if hydrogen combustion occurs to the outside of the cover, although the oxidation for lead frame does not occur but the bonding condition varies with respect to the following points and the stability for the bondability is reduced.

(1) Since the temperature for the lead frame and the capillary becomes unstable due to the change of the circumstantial temperature, the ball formation and the pressbonding operation under heating in the first and second bonding become unstable.

(2) Since the extent of heat expansion varies or defective operation occurs for each of the constituent portions of the device due to the variations in the circumstantial temperature, the positional accuracy for the bonding is worsened.

(3) Since the screen of the pattern recognition device fluctuates due to the occurrence of so-called air filaments due to combustion, the pattern recognizing accuracy is reduced.

On the other hand, in the present embodiment, since the lead frame oxidation preventive gas 223 is controlled so that it contains hydrogen of less than 4%, hydrogen combustion in the lead frame oxidation preventive gas 222 can be prevented and, as a result, the stability of the bondability can be maintained.

That is, if the oxidation preventive reducing gas 222 in the cover 227 should escape externally from the window 228 due to advance and retraction of the capillary 211, combustion of the hydrogen gas contained by less than 4% in the reducing gas 222 does not take place. Since hydrogen does not burn if the mixing ratio with air is less than 4%, combustion of hydrogen in the escaped reducing gas 222 can be prevented by controlling the hydrogen content to less than 4% by the gas supply unit 226.

Since the combustion out of the cover 227 can thus be prevented, the generation of air filaments is suppressed and the circumstantial temperature can be kept constant and, accordingly, the ball-forming or press-bonding operation by heating, as well as positional accuracy for bonding and accuracy for pattern recognition are stabilized and, as a result, reduction in the stability of the bondability accompanying them can be prevented.

This embodiment can provide the following advantages effects.

(1) Since the amount of hydrogen evolved in the grain boundary of the ball formed by melting can be decreased by suppressing the hydrogen content in the ball-forming gas to about 3%, increase in the ball hardness can be prevented and the bondability in the first bonding can be improved.

(2) Since the lowering in the temperature of the ball can be prevented even if a gas is blown to the ball formed by melting, by preheating, the ball-forming gas, increase in the hardness of the ball can be prevented coupled with the effect as described in (1) above.

(3) Since the combustion of the escaped reducing gas can be suppressed by setting the hydrogen content in the reducing gas supplied to the lead frame to less than 4%, reduction in the stability for the bondability due to the change in the bonding conditions accompanying combustion can be prevented, thereby improving the bonding, thus, the quality and the reliability of the products.

(4) Since the use of then copper type wire and the lead frame can be realized by preventing the reduction of the bondability in the copper type wire and the lead frame, reduction in the cost, etc. can be promoted.

(5) Since satisfactory metal bondability can be maintained to ensure adequate bondability, by surely preventing the formation of oxide layers, it is possible to improve the quality and the reliability of the bonding and, thus, the products.

(6) Since the escape of the reducing gas can be minimized by laying the cover on the feeder and opening a window of a least minimum opening surface required for the bonding operation to the cover, the reducing gas can be formed more effectively, while the amount of gas used can be suppressed.

Although the invention made by the present inventors has been described specifically referring to the examples, the present invention is not restricted only to the examples and may be modified variously within a scope not departing the gist thereof.

For instance, the content of hydrogen in the ball-forming gas (shield gas) is not restricted to about 3% but is may be less than 3%. Particularly, in a case where the natural oxidation of the wire is completely prevented before the ball formation, a non-oxidative gas containing no hydrogen may be used as the shield gas.

The wire used is not restricted only to the copper type but aluminum or allow type wire may be used.

The lead frame is not restricted only to the copper type but iron-nickel lead frame, etc. may also be used.

Although the explanation has been made mainly to the case of applying the invention to the wire bonding technique utilizing the press-bonding under heating combined with the ultrasonic vibrations, which is the background art for the present invention, the present invention is no way limited only thereto, but is also applicable to wire bonding of press-bonding system under heating.

The present invention is applicable at least to the wire bonding techniques in general, using reducing gas.

What is claimed is:

1. A fabrication method for a semiconductor device having a semiconductor pellet, at least one bonding pad, having a major surface, disposed on one major surface of the pellet, and at least one lead member disposed outside the pellet, comprising:

(a) forming a ball on an end of a bonding wire, projecting from the tip of a bonding capillary, by electric discharge between the end of the wire and an electrode, in a reducing gas atmosphere including at least hydrogen, the hydrogen being contained in the gas atmosphere in an amount smaller than 4% by volume, the gas atmosphere having a temperature of at least 100° C., but lower than a temperature at which the wire sticks to the bonding capillary, the gas atmoshpere, at the gas atmosphere temperature, being supplied through nozzles directed at the end of wire, the gas atmosphere being maintained at said temperature at least while the ball is being hardened, so as to provide a softened ball as compared to the hardness of a ball formed in a gas atmosphere at lower temperatures, the wire being made of copper; and (b) ball-bonding the wire to the pad through the ball with the capillary, by pushing the ball against the major surface of the pad vertically while the ball is projected from the tip of the capillary, whereby, due to said softened ball, cracking during ball-bonding is avoided while a predetermined bonding area is achieved.

2. A fabrication method according to claim 1, further comprising:

(c) after the step (b), transferring the capillary to a position above one end portion of the lead; and then (d) wedge-bonding the wire to the one end portion of the lead with the capillary by pushing the wire against the surface of the lead.

3. A fabrication method according to claim 2, wherein the bonding pad is made of aluminum.

4. A fabrication method according to claim 3, wherein the electric discharge is performed with the bonding wire as an anode and the electrode as a cathode.

5. A fabrication method according to claim 4, wherein the electric discharge is generated between the end of the wire and the electrode, the end of the wire and the electrode being separated a predetermined distance.

6. A fabrication method according to claim 5, wherein the bonding wire is bonded to the pad by heating in combination with ultrasonic vibration.

7. A fabrication method according to claim 6, wherein the wire is bonded to the lead by heating in combination with ultrasonic vibration.

8. A fabrication method according to claim 8, wherein the gas atmosphere temperature is higher than 150° C.

9. A fabrication method according to claim 8, wherein the gas at atmosphere is not greater than 200° C. in temperature.

10. A fabrication method according to claim 9, wherein the gas atmosphere comprises, in addition to hydrogen, at least one of nitrogen and argon.

11. A fabrication method according to claim 10, wherein the gas atmosphere consists of hydrogen and at least one of nitrogen and argon.

12. A fabrication method according to claim 10, wherein the hydrogen is in the gas atmosphere in an amount smaller than 3% by volume.

13. A fabrication method according to claim 5, wherein the gas atmosphere is not greater than 200° C. in temperature.

14. A fabrication method according to claim 13, wherein the gas atmosphere comprises, in addition to hydrogen, at least one of nitrogen and argon.

15. A fabrication method according to claim 14, wherein the gas atmosphere consists of hydrogen and at least one of nitrogen and argon.

16. A fabrication method according to claim 14, wherein the hydrogen is in the gas atmosphere in an amount smaller than 3% by volume.

17. A fabrication method according to claim 5, wherein the wire is bonded to the lead by heating in combination with ultrasonic vibration.

18. A fabrication method according to claim 17, wherein the gas atmosphere temperature is at least 150° C.

19. A fabrication method according to claim 2, wherein the electric discharge is performed using the bonding wire as an anode and the electrode as a cathode.

20. A fabrication method according to claim 19, wherein the electric discharge is generated between the end of the wire and the electrode, the end of the wire and the electrode being separated a predetermined distance.

21. A fabrication method according to claim 20, wherein the bonding wire is bonded to the pad by heating in combination with ultrasonic vibration.

22. A fabrication method according to claim 21, wherein the wire is bonded to the lead by heating in combination with ultrasonic vibration.

23. A fabrication method according to claim 22, wherein the bonding pad is made of aluminum.

24. A fabrication method according to claim 23, wherein the gas atmosphere temperature is at least 150° C.

25. A fabrication method according to claim 24, wherein the gas atmosphere temperature is not greater than 200° C.

26. A fabrication method according to claim 25, wherein the gas atmosphere includes, in addition to hydrogen, at least one of nitrogen and argon.

27. A fabrication method according to claim 26, wherein the hydrogen is contained in the gas atmosphere in an amount smaller then 3% by volume.

28. A fabrication method according to claim 2, wherein the wire is wedge-bonded to the one end portion of the lead in a lead oxidation-preventing gas atmosphere.

29. A fabrication method according to claim 28, wherein the lead oxidation-preventing gas atmosphere contains hydrogen.

30. A fabrication method according to claim 29, wherein the hydrogen is contained in the lead oxidation-preventing gas atmosphere in an amount less than 4% by volume.

31. A fabrication method according to claim 1, wherein the gas atmosphere has a temperature of 100° C.-200° C.

32. A fabrication method according to claim 31, wherein the gas atmosphere has a temperature of 150° C.-200° C.

33. A fabrication method according to claim 32, wherein the gas atmosphere is also supplied through nozzles directed at the electrode.

* * * * *